April 24, 1962 B. C. SHER ET AL 3,031,344

PRODUCTION OF ELECTRICAL PRINTED CIRCUITS

Filed Aug. 8, 1957

INVENTORS
Ben C. Sher
Hal F. Fruth
By: Wallenstein & Spangenberg Attys.

3,031,344
PRODUCTION OF ELECTRICAL PRINTED CIRCUITS

Ben C. Sher, Chicago, and Hal F. Fruth, Skokie, Ill., assignors to Radio Industries, Inc., Chicago, Ill., a corporation of Illinois Filed Aug. 8, 1957, Ser. No. 676,936
23 Claims. (Cl. 117—212)

This invention is directed to improvements in the production of electrical printed circuits.

There are various methods in current use, and numerous additional methods and procedures have been suggested for use, for the production of electrical printed circuits.

One procedure, for example, comprises molding an insulating or dielectric material, for instance, hard rubber, into a flat plate with a series of grooves or channels, and then filling said grooves or channels with a copper foil which is pressed into fixed position in said grooves or channels. The copper filled grooves or channels represent the circuitry which, of course, has previously been designed as reflected by the particular arrangement of the grooves or channels.

Another typical approach is to laminate a thin sheet of copper to a base of an insulating material such as Bakelite, and cover certain areas of the copper surface with a so-called "resist" coating (which may, for example, be a resinous adhesive material). The areas covered by said resist may comprise the circuitry arrangement. The resulting sheet is then dipped in an acid solution or the like which will dissolve the copper away from those areas with which said acid solution comes in contact. Those areas which are covered by the "resist" coating are protected from the acid solution and the copper thereunder is not dissolved away by the acid solution. The "resist" coating is then dissolved away with a suitable solution, which may be a caustic soda solution or organic solvent solution, depending upon the nature of the resist, and this results in a Bakelite or like insulating base having circuitry thereon in the form of lines of copper. The copper lines may then be electroplated to deposit a heavier layer of copper thereon if deisred, or, in certain instances, a coating of silver is applied to the copper where silver is the desired conductive surface.

Still another suggested method of producing printed circuits is to coat an insulating base with metallic silver, then stencil or silk-screen a resist over those portions on which no conductor is desired, then electroplate copper on the exposed silvered areas, and finally remove the resist and the portions of the silver coating lying under said resist.

There are, additionally, other procedures which employ special electroplating operations and photographic or photo-engraving techniques for the production of electrical printed circuits. They, as well as the previously described and other procedures, are disclosed in various publications and patents, typical of which are the following U.S. Patents: Nos. 2,441,960; 2,443,119; 2,506,604; 2,585,752; 2,587,568; 2,600,343; 2,641,675; 2,666,008; 2,699,424; 2,699,425; 2,706,697; 2,711,983; 2,721,152; 2,721,153; 2,721,822; 2,728,693; 2,734,150; 2,739,881; 2,747,977; 2,757,443; 2,758,074; 2,776,235; 2,777,193; and 2,783,193.

Generally speaking, while various procedures and techniques for the production of printed circuits have gone into wide commercial usage, they tend to have certain shortcomings. In some instances, there are problems of production, in others adherence to the insulated base has presented difficulties, but in all of the known procedures the matter of relatively high production cost is a deterrent to more widespread use of printed circuits.

In accordance with the present invention, material improvements have been made in regard to the production of printed circuits, enabling such production to be carried out in a relatively simple way at markedly low cost and with the obtaining of printed circuit units which are highly effective and which will withstand considerable abuse.

In general, the printed circuits of the present invention are made by coating an insulating base, which may be a sheet of Bakelite, polystyrene, hard rubber, urea-formaldehyde resins or other known insulating material, with a liquid suspension containing a resin, finely divided particles of a water-insoluble carrier hereafter described in detail, said carrier having a coating thereon of a noble metal or a noble metal salt or other compound (hereafter called salt) reducible to the noble metal. The coating may be effected by a simple dipping or brushing or spraying or similar operation, it being understood that the suspension should be relatively uniform at the time that the coating operation is carried out. Since the finely divided carrier normally tends to settle out from the aqueous suspension, it is advisable to stir or agitate said suspension to maintain it of relatively uniform character, or suspending agents, such as bentonites, sodium carboxymethyl cellulolse, or colloidal silica products, can be used to aid in maintaining the carrier in suspension.

After the coating operation, in which a convenient thickness of coating may be of the order of about 1 mil, although this may be varied appreciably, the coated insulating base sheet is then treated, if necessary, to effect the insolubilization of the resin. This is generally accomplished by heat or curing, the curing temperature selected being dependent upon the particular resin utilized. In any event, after curing, if necessary, the insulating base has a strongly adherent coating, of matte finish, thereon of the cured water-insoluble resin. Essentially uniformly carried in said resin is the carrier in the form of finely divided particles, and supported on said carrier particles is the finely divided noble metal.

From this point on, to complete the production of the printed circuit, numbers of different techniques, per se known in the art, can be employed. Thus, for instance, a suitable resist may be applied, through stenciling, silk screening or other technique, to cover the entire surface of the previously coated insulating base except in those areas which are to constitute the conductive circuitry of the printed circuit. The resist may be selected from any one of large numbers of available commercially marketed materials of this type which are generally in the category of lacquers, waxes, resins and plastisols. Typical examples of such latter materials are rubbery phenolic compounds and vinyl plastisols, for instance, "Geon" (vinyl chloride polymer) admixed with a plasticizer such as dioctyl phthalate. The areas which are not coated with the resist can then be coated with an overlying layer of copper and this may be particularly advantageously achieved through the use, for instance, of a copper deposition solution, a suitable one comprising an alkaline copper tartrate solution containing from about 1% to about 5% copper tartrate (calculated as $CuSo_4.5H_2O$). The resist may then be removed although it is usually not necessary to do this. The resin coating and the finely divided carrier coated with noble metal lying thereon and thereunder ordinarily may be allowed to remain since it does not adversely affect the finished printed circuit.

Other procedures, involving the use of photographic and photoengraving techniques, photosensitive resists, and the like can be used, if desired, to obtain predetermined electrically conductive areas or configurations on the insulating base through the utilization of the coating suspensions of the present invention.

The aforesaid liquid suspension may be of aqueous or nonaqueous character. In the case of aqueous suspensions, a water-soluble (or readily water-dispersible) resin is utilized which, after being coated on the insulating base, is converted to a water-insoluble state. Where water-soluble resins are used, it is convenient to include in the aqueous suspension the finely divided carrier particles, noble metal salt, reducing agent for reducing the noble metal salt to the noble metal, and preferably, a wetting or surface tension reducing agent, in which case the noble metal is deposited in situ on the finely divided carrier particles. Alternatively, in the case of the use of aqueous suspensions, said suspensions may be made by admixing water, the water-soluble resin, and previously finely divided carrier particles on which there has already been deposited finely divided particles or coatings of noble metal with or without an overlying layer or coating of copper. In other words, in this form of the invention, the aqueous suspension does not include the reducible noble metal compound and the reducing agent, and the noble metal is not deposited in situ on the finely divided carrier particles. Rather, in a separate operation, noble metal is coated onto or deposited on the finely divided carrier particles in any suitable manner, as by reduction from a noble metal salt, with which the carrier particles are initially contacted, by spray-metallizing, or evaporative techniques, after which a coating of copper may be placed on the noble metal in any suitable manner, especially by dipping in a copper deposition solution as mentioned above, and the thus noble metal coated carrier particles, or the noble metal-coppered carrier particles, as the case may be, are then admixed with the water and water-soluble resin, preferably in conjunction with a wetting agent or surface active agent, to produce the suspension.

In still another variant, although not preferred, procedure, an aqueous suspension is made containing water, the water-soluble resin and the finely divided carrier, in the general proportions set forth below. The insulating base is then coated with said suspension and then the coated base is heated, if necessary, to cure and insolubilize the resin. The resulting resin-coated insulated base is then dipped into a noble metal salts solution and then a reducing agent is added to reduce the noble metal salt to noble metal which will adhere to the carrier particles. Thereafter, the coated insulating base may be treated in the same manner as in the previously described embodiments to produce the printed circuits.

Where the coating suspension is of generally nonaqueous character, resins which are soluble in organic solvents are utilized. In this case, the liquid suspension will comprise the organic solvent solution of the resin carrying in suspension the carrier particles on which were previously deposited a coating of noble metal. By "nonaqueous," as used herein, it is not meant to exclude water entirely but, rather, said term "nonaqueous" is intended to include those compositions in which the solvent for the resin is either wholly or essentially or mainly of organic character. Thus, for instance, various of the resins which can be used in the practice of the present invention are soluble in commercial ethyl alcohol (which contains about 5% water) and such solutions, and the suspensions made therewith, are, for purposes of the present invention and for convenience, included within the designation "nonaqueous."

The viscosity or thickness of the coating suspension can be varied in a number of ways, for instance, by changing the proportions of the water or organic solvent, the resin, and the finely divided carrier, as well as through the use of extraneous agents. Through this approach, for example, a sufficiently low amount of water can be used, in the aqueous coating suspensions, so as to produce a viscosity akin to that of certain printing inks. The resulting aqueous suspension can then be coated onto an insulating base, through silk screening or stenciling procedures or through letter press, offset or other printing techniques. In this situation, no resist need be used. Rather, the aqueous suspension is silk screened or stenciled or printed onto the insulating base in the lines or configurations predetermined to represent the desired circuitry. An analogous approach can be taken with nonaqueous suspensions. Thereafter, if desired, one or more deposits of metallic copper, or silver or other conductive metal, can be placed on the original noble metal areas or configurations through various metal deposition procedures, for instance, as mentioned above.

The finely divided carriers may be selected from a large group among which may be mentioned powdered metals such as iron, nickel, titanium, zirconium, aluminum, zinc, copper and manganese; silicon; metallic oxides such as aluminum oxide, zirconium oxide, barium oxide, calcium oxide, magnesium oxide, chromium oxides, iron oxides, lead oxides, manganese oxides, nickel oxides, strontium oxide, tin oxides and zinc oxide; graphite; activated materials such as activated carbon, activated alumina, activated silica and activated nickel; metallic titanates, zirconates, manganates and stannates such as those of the alkaline earth metals as, for instance, barium titanate, calcium titanate, lead titanate, barium stannate, strontium stannate, bismuth stannate, strontium titanate, strontium zirconate, barium zirconate, lead zirconate, barium manganate, calcium manganate, magnesium manganate and strontium manganate; ion exchange materials such as those of the permutit type (e.g. "Zeodur"), and sulfonated aromatic (phenolic) carboxylates; and compatible mixtures of any two or more of the above, as well as other refractory materials to which a noble metal will adhere strongly such as quartz, glass, metal carbides such as tungsten carbide, silicon carbide, tantalum carbide, and the like. As stated above, the particle size of the carriers must not be too fine else they will not rise to and through the surface of the resin when the latter is insolubilized after being coated on the insulating base. In general, for good results, the mesh size of the carrier will fall within the range of about 200 to 600 mesh, with about 300 to 325 mesh giving particularly satisfactory results at least in most cases.

The quantity of the carrier, and to some extent the nature of the carrier, utilized plays an important role in the fully successful practice of the present invention. In general, the quantity of the carrier used in the suspension and the particle size of the carrier must be such that, in the cured or insolubilized resin film or coating on the insulating base, said carried comes to and is present on the surface of the said coating or so close thereto that simple abrasion of the coated surface will serves to expose it. While the noble metal is at least in the main present on the particles of the carrier, it will be appreciated that some of the noble metal may be present as finely dispersed particles in the cured or insolubilized resin and on the exposed surface thereof.

The water-soluble or readily water-dispersible resins (herein generically referred to as water-soluble resins), and the organic solvent-soluble resins, which are advantageously of the urea-formaldehyde type; phenol-aldehyde, particularly phenolformaldehyde, type; water-soluble shellacs; water-soluble rosins; water-soluble furfural resins; water-soluble caseinates which are convertible to form an insoluble dielectric film; and the like are, per se, well known articles of commerce and their preparation and formulation, which form no part of the present invention, are described in numerous patents and other publications. A very suitable typical example of such water-soluble resins is the product sold under the trade name BRL–1100 (Durez 175) which, as purchased on the open market, contains approximately 65% solids. A very suitable typical example of the organic solvent-soluble resins is the product sold under the trade name Durez Resin #11623, which is a phenolic resin. As previously pointed out, said water-soluble resins are convertible to a water-insoluble state, generally by a heat cure at elevated temperatures. The resins used herein, in their water-insoluble state, produce films or coatings which adhere firmly to the insulating base and are of dielectric or non-electric conducting character.

In that embodiment of the invention in which the aqueous suspensions, used for coating the insulated base, contain a noble metal salt, various noble metal salts which are reducible to the noble metal can be used. Typical of such are silver nitrate, palladium nitrate, gold chloride and platinic chloride, and soluble salts of rhodium and ruthenium.

The wetting agent, which constitutes an optional though desirable ingredient, usually used in small proportions, for instance, 0.05 to 0.1%, can be selected from large numbers of such agents which are available on the commercial market as, for example, dioctyl sodium sulfosuccinate ("Aerosol OT"), lauryl sodium sulfate, isopropyl naphthalene sodium sulfonate, dodecyl benzene sodium sulfonate, and the like.

While the proportions of the constituent ingredients of the suspensions, used for coating the insulating base or predetermined areas thereof, are variable within relatively wide limits, good results have been obtained with coating compositions containing the following ingredients in substantially the stated relative amounts:

| | | |
|---|---|---|
| Water | cc | 100 |
| Water-soluble resin which is adapted to be converted by heat to a water-insoluble state (calculated on 65% solids basis) | cc | 73 |
| Finely divided carrier | g | 230 |
| Formalin | cc | 50 |
| Silver nitrate or gold chloride or platinic chloride or palladium nitrate or other reducible noble metal salt | g | 23 |
| Wetting agent | g | 0.1 |

As stated above, the proportions of the water and other constituents can also be modified so as to bring about any desired change in the viscosity characteristics of the suspension.

Moreover, in that embodiment where the suspension contains the preformed noble metal-coated carrier, the aqueous or nonaqueous suspension, as the case may be, need contain only the resin, the solvent therefor, and the noble metal-coated finely divided carrier and the relative proportions may conveniently be as follows:

| | | |
|---|---|---|
| Solvent (water or organic solvent) | cc | 100 |
| Resin which is adapted to be converted by heat to a water-insoluble state (calculated on 65% solids basis) | cc | 50–85 |
| Carrier whose finely divided particles carry a coating of noble metal thereon | g | 155–265 |

A particular embodiment of a suitable nonaqueous coating suspension is as follows:

| | | |
|---|---|---|
| Ethyl alcohol (commercial) | cc | 100 |
| Alcohol-soluble phenolic resin (Durez Resin #11623) | cc | 100 |
| Finely divided particles of carrier having a coating thereon of a noble metal | g | 180 |
| Wetting agent | g | 0.05 |

It may be pointed out that the finely divided carrier particles may conveniently be treated preliminarily by slurrying the same with an aqueous solution of silver nitrate or palladium nitrate, for instance, by slurrying said carrier particles in a ratio of 100 g. thereof with 1 liter of a 6% aqueous solution of silver nitrate or palladium nitrate. The mass may then be filtered, the solids washed twice, in each case with 1 liter of water, and then dried. The resulting treated carrier particles can then be incorporated into the coating suspension. Reduction of the silver nitrate or palladium nitrate to metallic silver or metallic palladium is effected during the subsequent copper coating wherein the copper coating solution contains a reducing agent. Alternatively, the slurrying solution may have a reducing agent, such as formaldehyde, incorporated therein; or still alternatively, the silver nitrate or palladium nitrate treated carrier particles may be subjected to the action of a reducing agent to reduce the silver nitrate or palladium nitrate to metallic silver or metallic palladium and the resulting noble metal coated carrier particles embodied in the liquid coating suspension.

In the accompanying drawing, which illustrates the nature of the present invention, FIG. 1 shows a plan view of an illustrative printed circuit unit made in accordance with the invention.

Figure 1:
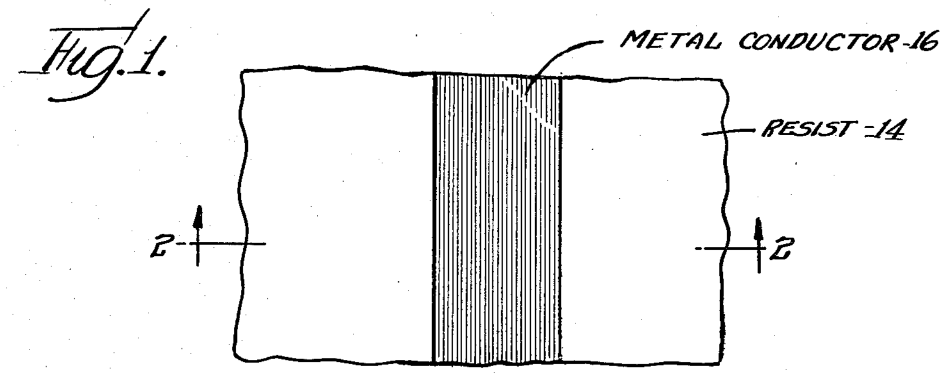
Figure 2:
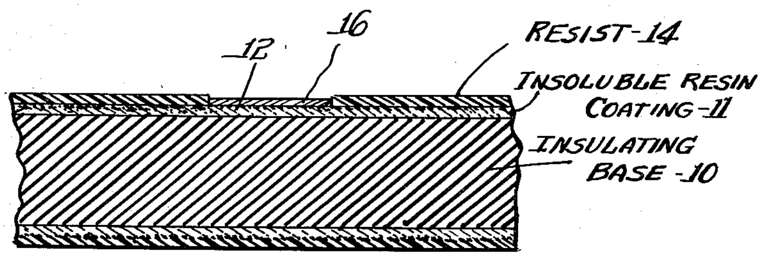
FIG. 2 is a sectional view in enlarged form, taken along the line 2—2.
Figure 3:
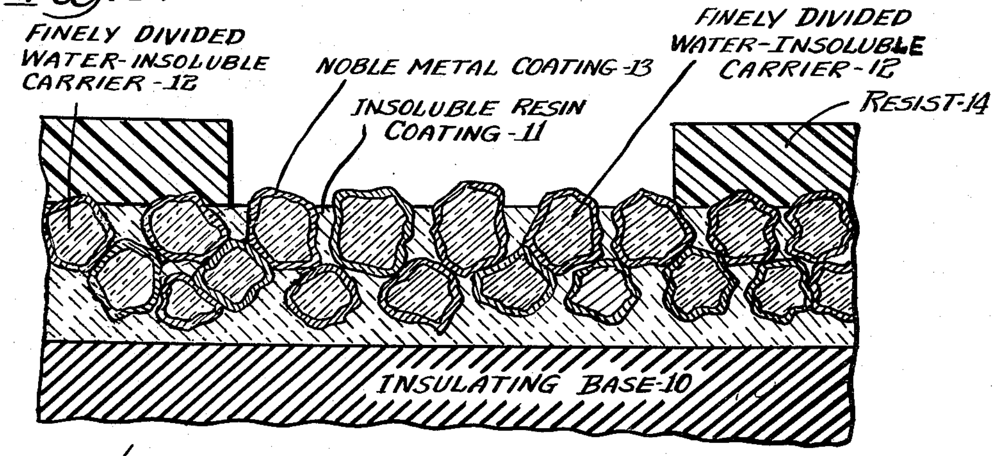
FIG. 3 is a sectional view generally similar to that of FIG. 2 but showing the components or elements of a circuit unit in very greatly enlarged or exaggerated form for purposes of clarity.
Figure 4:
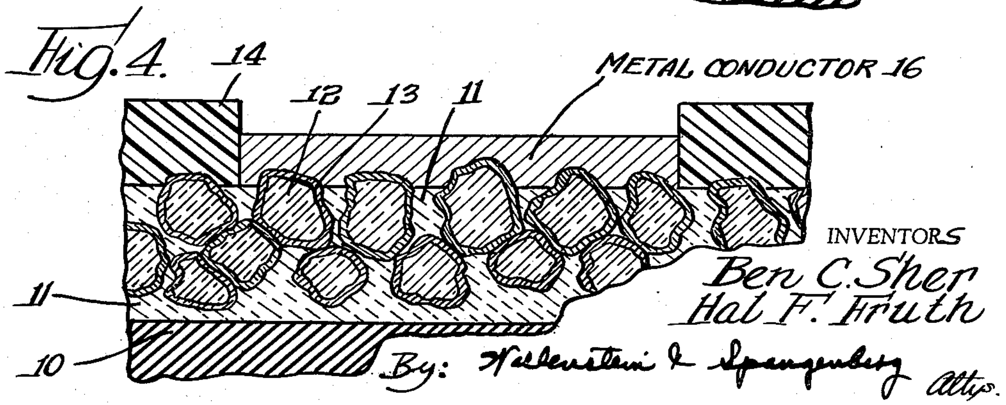
FIG. 4 is a sectional view similar to that of FIG. 3 but including a metal conductor deposited over the noble metal coated insoluble finely divided carrier particles.

As shown in said drawing, the insulating base 10 carries an insoluble resin coating 11 suspended within which are finely divided particles 12 of a water-insoluble carrier, said particles 12 being coated with or supporting a noble metal 13 such as silver. It will be seen, more particularly from FIGS. 3 and 4, that the particles 12 carrying coatings 13 are adjacent the surface and, generally, penetrate through the surface of the resin coating 11. In connection with completing the production of the printed circuit, the drawing shows the application of a resist 14 to predetermined areas of the coated insulating base after which the areas not coated with the resist are appropriately coated with a metal conductor 16, such as copper, to provide the desired circuitry.

Printed circuits made pursuant to the invention can very readily be made in which the circuit is provided either on one or on both surfaces of the insulating base. Where the opposite surfaces of the insulating base are to be provided with circuitry, which is a desideratum in the interests of reduction in cost and saving of weight and space but which has provided particularly acute problems in the past so far as satisfactorily meeting such problems is concerned, the insulating base is provided with a plurality of apertures extending therethrough in a predetermined spatial arrangement. It is frequently important in such printed circuitry that the inner surfaces of the apertures be coated with a conductive metal, usually copper, coating for terminal or electrical connection purposes. The present invention makes it possible to accomplish this result simply, inexpensively and effectively since, for instance, the dipping of the apertured insulating base in the aqueous suspension serves to provide the initial coating not only on the opposite surfaces but, also, on the inner surfaces of the apertures. Thereafter, said inner surfaces and the opposite surfaces can be treated readily to deposit copper in an overlying adherent coating on the noble metal particularly advantageously by simple dip plating procedures.

While the present invention is especially concerned, as pointed out above, with improvements in the field of printed circuits, which includes the production of condenser, resistor and semi-conductor units and other circuit components, the invention has certain broader utilities with respect to the provision of novel and useful techniques for enabling metal deposits of predetermined pattern or configuration to be made on insulating bases for decorative or still other purposes. Thus, articles of manufacture are obtainable simply and at low cost in which a predetermined area pattern or configuration of metallic members is secured to an insulating base.

What we claim as new and desire to protect by Letters Patent of the United States is:

1. A composition, having particular utility for depositing adherent coatings containing a noble metal on an insulating base, comprising an aqueous suspension containing a water-soluble resin which is adapted to be converted to a water-insoluble state; finely divided particles of a water-insoluble carrier adapted to carry an adherent noble metal coating, the particle size and amount of said carrier being such as to cause said carrier to come substantially to or through the surface of said resin when coated onto said insulating base and converted to a water-insoluble state; and a reducible noble metal salt.

2. A composition, having particular utility for depositing adherent coatings containing a noble metal on an insulating base, comprising an aqueous suspension containing a water-soluble resin which is adapted to be converted to a water-insoluble state; finely divided particles of a water-insoluble carrier adapted to carry an adherent noble metal coating, the particle size and amount of said carrier being such as to cause said carrier to come substantially to or through the surface of said resin when coated onto said insulating base and converted to a water-insoluble state; silver nitrate; and formaldehyde.

3. A composition, having particular utility for depositing adherent coatings containing a noble metal on an insulating base, comprising a liquid suspension containing a water-soluble resin which is adapted to be converted to a water-insoluble state; and finely divided particles of a water-insoluble carrier adapted to carry an adherent noble metal coating, the particle size and amount of said carrier being such as to cause said carrier to come substantially to or through the surface of said resin when coated onto said insulating base and converted to a water-insoluble state; at least a substantial proportion of said carrier having a coating of a noble metal thereon.

4. The composition of claim 3, wherein said carrier comprises particles having a mesh size in the range of 200 to 600, said particles being made of a ceramic metal titanate.

5. The composition of claim 3, wherein said carrier comprises particles having a mesh size in the range of 200 to 600, said particles being made of a ceramic metal zirconate.

6. The composition of claim 3, wherein said carrier comprises particles having a mesh size in the range of 200 to 600, said particles being made of a metallic oxide.

7. The composition of claim 3, wherein said carrier comprises particles having a mesh size in the range of 200 to 600, said particles being made of a metal.

8. A composition, having particular utility for depositing adherent coatings containing a noble metal on an insulating base, comprising a liquid suspension containing a solvent-soluble resin which is adapted to be converted to an insoluble state; finely divided particles of a carrier having a mesh size in the range of 200 to 600 and in amount sufficient to come substantially to or through the surface of said resin when coated onto said insulating base and converted to an insoluble state, at least a substantial proportion of said carrier particles having a coating of a noble metal thereon.

9. A composition, having particular utility for depositing adherent coatings containing a noble metal on an insulating base, comprising a liquid suspension containing the following ingredients in substantially the stated relative amounts:

| | |
|---|---|
| Solvent ____cc__ | 100 |
| Solvent-soluble resin which is adapted to be converted to an insoluble state (calculated on 65% solids basis) ____cc__ | 50–85 |
| Finely divided carrier (200 to 600 mesh) __g__ | 150–250 |
| Reducing agent ____cc__ | 30–60 |
| Noble metal compound ____g__ | 15–30 |

10. An article of manufacture having a predetermined pattern of metallic members secured to an insulating base, which comprises an insulating base carrying an adherent coating comprising a water-insoluble resin and a finely divided water-insoluble carrier having a finely divided noble metal supported on said insoluble resin, said noble metal forming a predetermined configuration.

11. An article of manufacture for us in the production of a printed electrical circuit, which comprises an insulating base carrying an adherent coating comprising a water-insoluble resin supporting and having distributed therein a finely divided water-insoluble carrier having a coating thereon of finely divided noble metal.

12. An article of manufacture for use in the production of a printed electrical circuit, which comprises an insulating base having a plurality of apertures extending therethrough in a predetermined spatial arrangement, said base and the inner surfaces of said apertures carrying an adherent coating comprising a water-insoluble resin supporting and having distributed therein finely divided particles of a water-insoluble carrier having a coating thereon of a finely divided noble metal.

13. An article of manufacture for use in the production of a printed electrical circuit, which comprises an insulating base having a plurality of apertures extending therethrough in a predetermined spatial arrangement, said base and the inner surfaces of said apertures carrying an adherent coating comprising a water-insoluble resin having distributed therein finely divided particles of aluminum oxide carrying a finely divided noble metal, said noble metal having an overlying adherent coating of metallic copper thereon providing continuous conductive circuit paths.

14. A printed electrical circuit which comprises an insulating base carrying an adherent coating comprising a water-insoluble resin, a finely divided water-insoluble carrier having a coating thereon of a finely divided noble metal supported on said insoluble resin, and said noble metal having an overlying coating of metallic copper thereon providing continuous conductive circuit paths, said metallic copper forming predetermined electrical circuitry.

15. A printed electrical circuit which comprises an insulating base having a plurality of apertures extending therethrough in a predetermined spatial arrangement, said base carrying on both sides thereof an adherent coating comprising a cured water-insoluble resin, predetermined electrical circuitry in the form of conductive paths comprising aluminum oxide having a mesh size of 200 to 600 carrying a finely divided noble metal, resulting from the reduction of a noble metal salt, supported on said insoluble resin, said noble metal having an overlying coating of metallic copper thereon, and the said inner surfaces of said apertures having an adherent coating of metallic copper thereon providing continuous conductive circuit paths.

16. In a method of producing printed electrical circuits, the steps which comprise coating limited areas of an insulating base by contacting the same with an aqueous suspension containing a water-soluble resin and a water-insoluble finely divided carrier having a coating thereon of a noble metal and an overlying copper deposit on said noble metal coating, and treating said coating whereby to render said resin water-insoluble, the particle size and amount of such carrier being such as to cause said carrier to come substantially to or through the surface of said water-insoluble resin.

17. In a method of producing printed electrical circuits, the steps which comprise coating an insulating base by contacting the same with a liquid suspension containing a solution of a resin and a water-insoluble finely divided carrier, treating said coating to render said resin water-insoluble, then depositing a noble metal onto said particles of carrier as supported on and by said water-insoluble resin, the particle size and amount of such carrier being such as to cause said carrier to come substantially to or through the surface of said water-insoluble resin, and then applying a conductive material over said coated portions of said insulating base.

18. In an electrical circuit, an insulating base having a conductive coating thereon, said coating having a bottom layer bonded to the insulating base and carrying at the surface thereof dispersed particles embedded in and projecting above said bottom layer, and a continuous upper layer of a conductive material overlying said dispersed projecting particles to form a continuous conductive layer.

19. A printed electrical circuit which comprises an insulating base having a plurality of continuous conductive paths forming a predetermined circuit configuration, said continuous conductive paths each comprising a coating having a bottom layer bonded to the insulating base and carrying at the surface thereof dispersed particles having outer surfaces of noble metal and embedded in and projecting above said bottom layer, and a continuous upper layer of copper over and extending between said dispersed projecting particles to form continuous conductive circuit paths.

20. A printed electrical circuit which comprises an insulating base having a plurality of apertures extending therethrough in a pre-determined spacial arrangement, said base having at least one side substantially covered all over with an adherent non-conductive coating which extends into said apertures, said adherent non-conductive coating comprising a layer of non-conductive material bonded to the insulating base and carrying at the surface thereof dispersed particles embedded in and projecting above said layer of non-conductive material, limited areas of said layer of non-conductive material on the outer surface of said insulating base having a continuous overlying layer of a conductive material anchored to said dispersed projecting particles thereof to form predetermined continuous conductive circuit paths extending between said apertures, and the portion of said adherent non-conductive coating extending into said apertures also having a continuous overlying layer of conductive material anchored to the dispersed projecting particles thereon to form a conductive extension of said conductive material on the outer surface of said insulating base.

21. A printed electrical circuit which comprises an insulating base having at least one side substantially covered all over with an adherent non-conductive coating comprising a layer of non-conductive material bonded to the insulating base and carrying at the surface thereof dispersed noble metal coated particles of insulating material embedded in and exposed above said layer of non-conductive material, and limited areas of said layer of non-conductive material having a continuous overlying layer of copper anchored to said noble metal coated particles to form predetermined continuous conductive circuit paths.

22. In a method of producing printed electrical circuits the steps which comprise applying to at least limited areas on one side of an insulating base a liquid suspension containing a solution of a resin and finely divided dispersed carrier particles, the particle size of said carrier particles being such as to cause the particles to come to the surface of said resin, treating said coating to form a solid resin layer over the insulating base with said carrier particles projecting above and dispersed over the surface of the resin layer, and then applying a continuous coating of conductive material over limited areas of said resin layer to form conductive circuit paths.

23. A method of producing an electrical circuit on an insulating base having spaced apertures defining terminal portions of various conductive paths, said method comprising the steps of applying to the defining walls of said apertures and substantially the entire surface area of at least one side of said base a solid insulating layer of a resinous insulating material at the surface of which are embedded dispersed exposed particles having outer surfaces of noble metal, and depositing copper over only limited areas of said resinous layer on the outer surface of said base and within said apertures to form circuit paths extending between and within said apertures, the copper adhering to the noble metal particles at the surface of said resinous layer.

References Cited in the file of this patent

UNITED STATES PATENTS

| | | |
|---|---|---|
| 2,190,672 | Meharg | Feb. 20, 1940 |
| 2,253,235 | Hempel | Aug. 19, 1941 |
| 2,441,960 | Eisler | May 25, 1948 |
| 2,461,878 | Christensen et al. | Feb. 15, 1949 |
| 2,683,673 | Silversher | July 13, 1954 |
| 2,694,016 | Craven | Nov. 9, 1954 |
| 2,702,252 | Suchoff | Feb. 15, 1955 |
| 2,721,153 | Hopf et al. | Oct. 18, 1955 |
| 2,721,357 | Hochberg | Oct. 25, 1955 |
| 2,761,849 | Coler | Sept. 4, 1956 |
| 2,776,235 | Peck | Jan. 1, 1957 |
| 2,799,600 | Scott | July 16, 1957 |

FOREIGN PATENTS

| | | |
|---|---|---|
| 305,237 | Great Britain | May 2, 1930 |

OTHER REFERENCES

"New Advances in Printed Circuits," November 22, 1948, National Bureau of Standards, Misc. Publication 192, pp. 1–68.